United States Patent
Luo et al.

(10) Patent No.: US 11,942,576 B2
(45) Date of Patent: *Mar. 26, 2024

(54) BLUE COLOR CONVERTER FOR MICRO LEDS

(71) Applicant: Applied Materials, Inc, Santa Clara, CA (US)

(72) Inventors: Yingdong Luo, Newark, CA (US); Lisong Xu, San Jose, CA (US); Sivapackia Ganapathiappan, Los Altos, CA (US); Hou T. Ng, Campbell, CA (US); Byung Sung Kwak, Portland, OR (US); Mingwei Zhu, San Jose, CA (US); Nag B. Patibandla, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 531 days.

This patent is subject to a terminal disclaimer.

(21) Appl. No.: 17/006,663

(22) Filed: Aug. 28, 2020

(65) Prior Publication Data

US 2022/0069174 A1    Mar. 3, 2022

(51) Int. Cl.
*H01L 33/50* (2010.01)
*C09K 11/02* (2006.01)
*C09K 11/06* (2006.01)
*H01L 33/00* (2010.01)

(52) U.S. Cl.
CPC .......... *H01L 33/504* (2013.01); *C09K 11/025* (2013.01); *C09K 11/06* (2013.01); *H01L 33/005* (2013.01); *C09K 2211/1007* (2013.01); *C09K 2211/1011* (2013.01); *C09K 2211/1014* (2013.01); *C09K 2211/1029* (2013.01); *C09K 2211/1033* (2013.01); *C09K 2211/1037* (2013.01); *C09K 2211/1044* (2013.01); *C09K 2211/1059* (2013.01); *C09K 2211/1092* (2013.01); *C09K 2211/185* (2013.01); *H01L 2933/0041* (2013.01)

(58) Field of Classification Search
CPC .................. C09K 11/025; C09K 11/06; C09K 2211/1007; C09K 2211/1011; C09K 2211/1014; C09K 2211/1029; C09K 2211/1031; C09K 2211/1027; C09K 2211/1044; C09K 2211/1059; C09K 2211/1092; C09K 2211/185

See application file for complete search history.

(56) References Cited

U.S. PATENT DOCUMENTS

| | | | |
|---|---|---|---|
| 6,565,770 B1 | 5/2003 | Mayer et al. | |
| 8,227,269 B2 | 7/2012 | Chen et al. | |
| 8,323,748 B2 | 12/2012 | Ling | |
| 8,404,154 B2 * | 3/2013 | Breen | C09K 11/02 428/404 |
| 8,425,065 B2 | 4/2013 | Ravillisetty et al. | |
| 9,111,464 B2 | 8/2015 | Bibl et al. | |
| 9,263,700 B2 | 2/2016 | Van Mol et al. | |
| 9,541,256 B2 | 1/2017 | Sung et al. | |
| 10,759,993 B2 | 9/2020 | Yang et al. | |
| 11,004,835 B2 | 5/2021 | Pschenitzka | |
| 11,404,612 B2 * | 8/2022 | Luo | H01L 33/504 |
| 2002/0034656 A1 | 3/2002 | Thompson et al. | |
| 2005/0040562 A1 | 2/2005 | Steinmann et al. | |
| 2005/0101684 A1 | 5/2005 | You et al. | |
| 2007/0015847 A1 | 1/2007 | Sun et al. | |
| 2010/0117106 A1 | 5/2010 | Trottier | |
| 2010/0295077 A1 | 11/2010 | Melman | |
| 2013/0137027 A1 | 5/2013 | Zhou et al. | |
| 2015/0125702 A1 | 5/2015 | He et al. | |
| 2015/0179973 A1 | 6/2015 | Willem et al. | |
| 2016/0075162 A1 | 3/2016 | Lefebvre et al. | |
| 2016/0107295 A1 | 4/2016 | Bajaj et al. | |
| 2016/0230961 A1 | 8/2016 | Seo et al. | |
| 2017/0069852 A1 | 3/2017 | Kanamoto et al. | |
| 2017/0100817 A1 | 4/2017 | Ganapathiappan et al. | |
| 2019/0002719 A1 | 1/2019 | Pousthomis et al. | |
| 2019/0011819 A1 | 1/2019 | Chou et al. | |

(Continued)

FOREIGN PATENT DOCUMENTS

| | | | |
|---|---|---|---|
| JP | 2000-273316 | * | 10/2000 |
| JP | 2014-199267 | * | 10/2014 |
| JP | 2015-121710 | * | 7/2015 |

(Continued)

OTHER PUBLICATIONS

International Search Report and Written Opinion in International Appln. No. PCT/US2021/047712, dated Dec. 17, 2021, 11 pages.

(Continued)

*Primary Examiner* — C Melissa Koslow
(74) *Attorney, Agent, or Firm* — Fish & Richardson P.C.

(57) ABSTRACT

A photocurable composition includes a blue photoluminescent material, one or more monomers, and a photoinitiator that initiates polymerization of the one or more monomers in response to absorption of the ultraviolet light. The blue photoluminescent material is selected to absorb ultraviolet light with a maximum wavelength in a range of about 300 nm to about 430 nm and to emit blue light. The blue photoluminescent material also has an emission peak in a range of about 420 nm to about 480 nm. The full width at half maximum of the emission peak is less than 100 nm, and the photoluminescence quantum yield is in a range of 5% to 100%.

18 Claims, 10 Drawing Sheets

(56) References Cited

U.S. PATENT DOCUMENTS

2019/0345351 A1 11/2019 Hoggett et al.
2020/0373279 A1 11/2020 Ganapathiappan et al.

FOREIGN PATENT DOCUMENTS

| JP | 2015-162280 | * | 9/2015 |
| JP | 2017-062458 | | 3/2017 |
| JP | 2020-030290 | * | 2/2020 |
| KR | 10-2018-0138023 | | 12/2018 |
| TW | 202014047 | | 4/2020 |
| WO | WO 2016/166514 | | 10/2016 |

OTHER PUBLICATIONS

Ma et al., "Recent Advances in High Performance Blue Organic Light-emitting Diodes Based on Fluorescence Emitters" J. Mater. Chem. C., 2020, 8(8):2614-42.
Office Action in Taiwanese Appln. No. 110130219, dated Jul. 4, 2022, 7 pages (with English search report).
Office Action in Taiwanese Appln. No. 110130219, dated Jul. 4, 2022, 8 pages (with English Summary and Search Report).

* cited by examiner

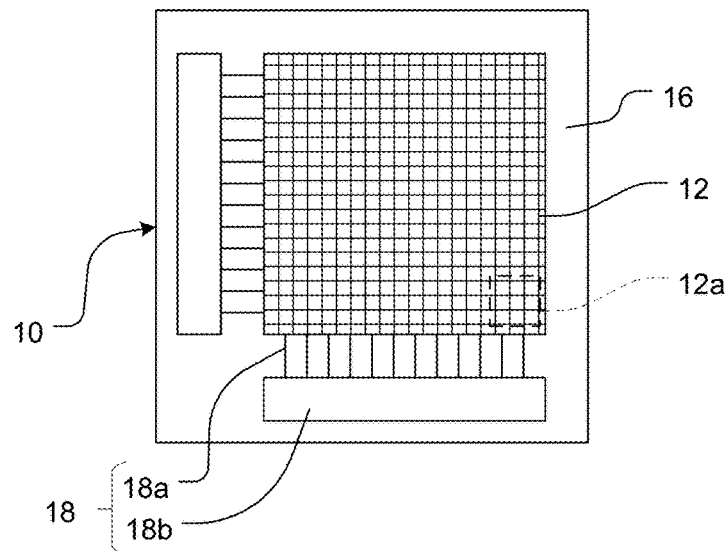
FIG. 2
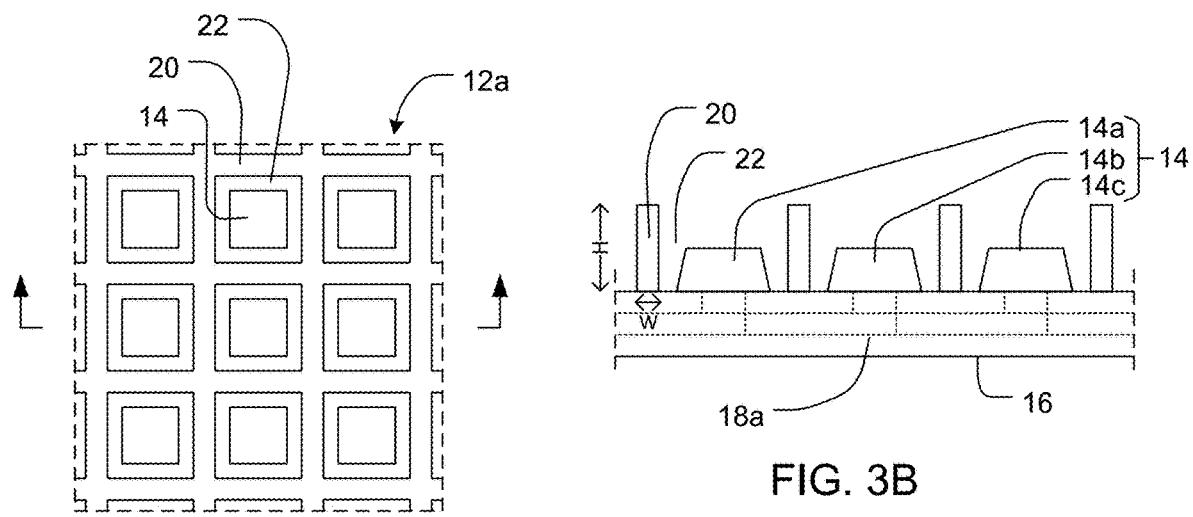
FIG. 3A
FIG. 3B

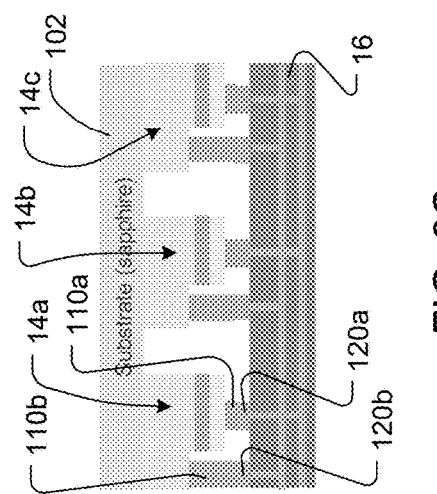
FIG. 6A
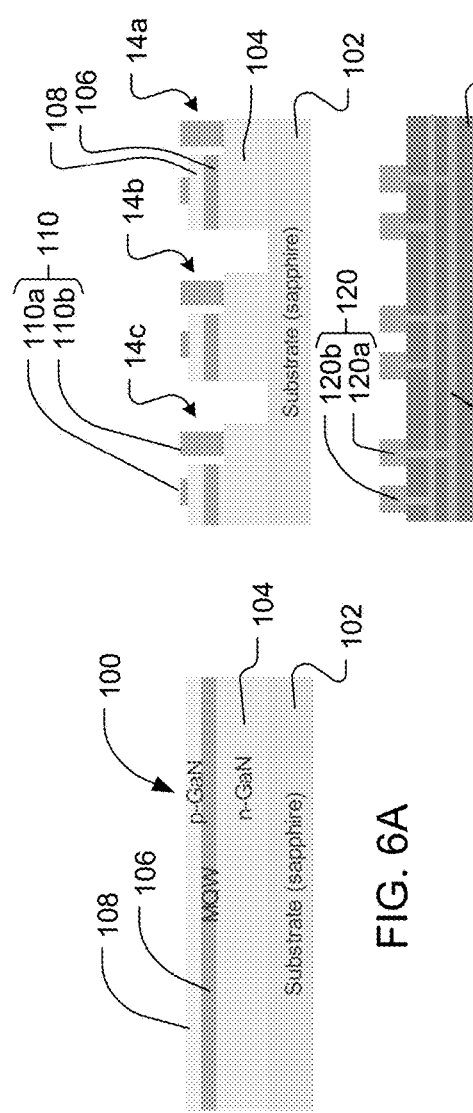
FIG. 6B
FIG. 6D
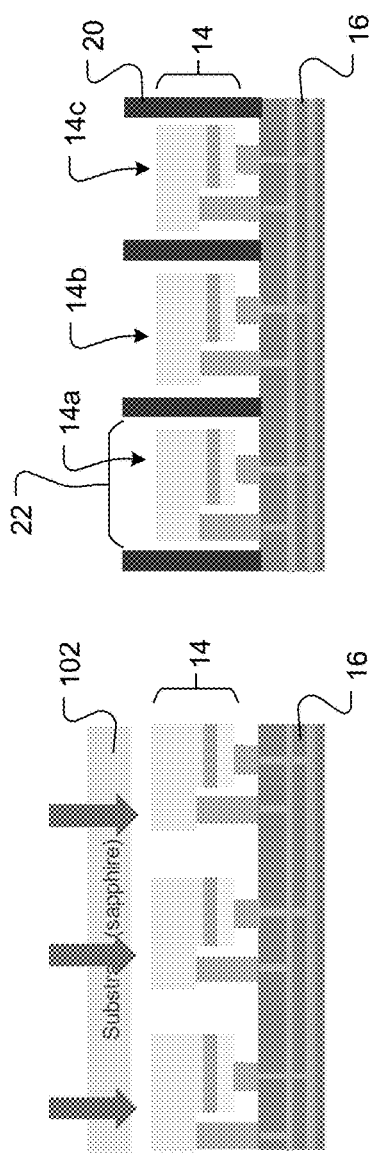
FIG. 6C
FIG. 6E

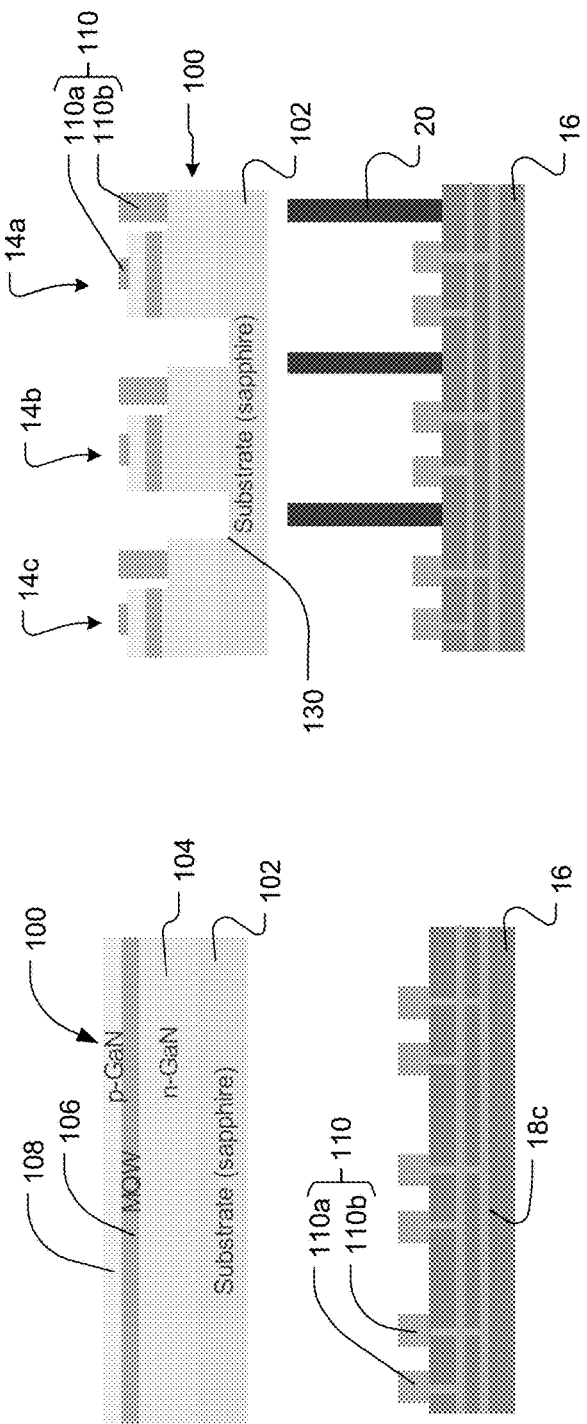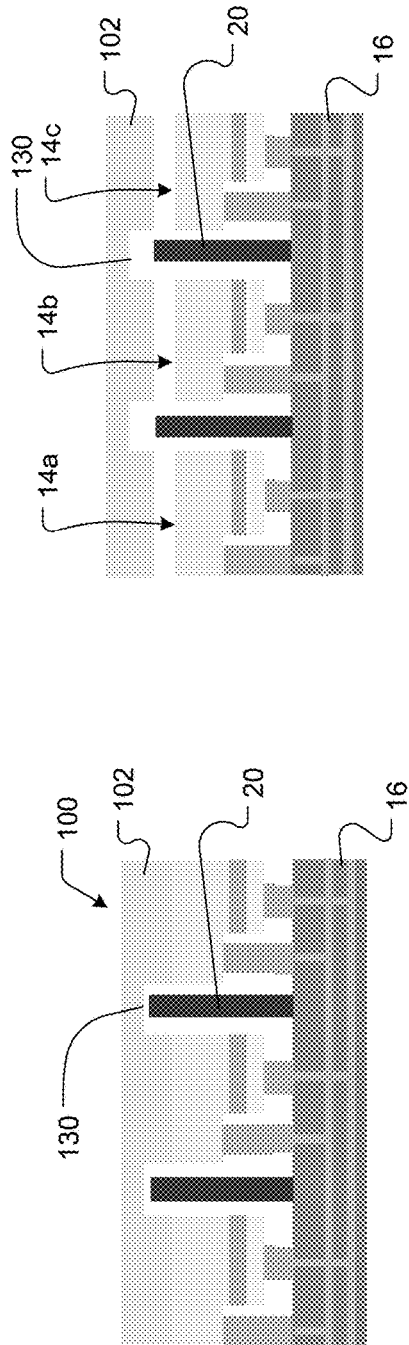

BLUE COLOR CONVERTER FOR MICRO LEDS

TECHNICAL FIELD

This disclosure generally relates to fabrications methods for blue color converters installed by self-aligned in-situ curing for micro-LEDs and systems and devices including the blue color converters.

BACKGROUND

A light emitting diode (LED) panel uses an array of LEDs, with individual LEDs providing the individually controllable pixel elements. Such an LED panel can be used for a computer, touch panel device, personal digital assistant (PDA), cell phone, television monitor, and the like.

An LED panel that uses micron-scale LEDs based on III-V semiconductor technology (also called micro-LEDs) would have a variety of advantages as compared to OLEDs, e.g., higher energy efficiency, brightness, and lifetime, as well as fewer material layers in the display stack which can simplify manufacturing. However, there are challenges to fabrication of micro-LED panels. Micro-LEDs having different color emission (e.g., red, green and blue pixels) need to be fabricated on different substrates through separate processes. Integration of the multiple colors of micro-LED devices onto a single panel typically requires a pick-and-place step to transfer the micro-LED devices from their original donor substrates to a destination substrate. This often involves modification of the LED structure or fabrication process, such as introducing sacrificial layers to ease die release. In addition, stringent requirements on placement accuracy can limit the throughput, the final yield, or both.

An alternative approach to bypass the pick-and-place step is to selectively deposit color conversion agents (e.g., quantum dots, nanostructures, photoluminescent materials, or organic substances) at specific pixel locations on a substrate fabricated with monochrome LEDs. The monochrome LEDs can generate relatively short wavelength light, e.g., purple or blue light, and the color conversion agents can convert this short wavelength light into longer wavelength light, e.g., red or green light for red or green pixels. The selective deposition of the color conversion agents can be performed using high-resolution shadow masks or controllable inkjet or aerosol jet printing.

However, shadow masks are prone to problems with alignment accuracy and scalability, whereas inkjet and aerosol jet techniques suffer from resolution (inkjet), accuracy (inkjet) and throughput (aerosol jet) problems. In order to manufacture micro-LED displays, new techniques are needed to precisely and cost-effectively provide color conversion agents for different colors onto different pixels on a substrate, such as a large area substrate or flexible substrate.

SUMMARY

This disclosure generally relates to fabrication methods for blue color converters installed by self-aligned in-situ curing for micro-LEDs and systems and devices including the blue color converters In a general aspect, a photocurable composition includes a blue photoluminescent material, one or more monomers, and a photoinitiator that initiates polymerization of the one or more monomers in response to absorption of the ultraviolet light. The blue photoluminescent material is selected to absorb ultraviolet light with a maximum wavelength in a range of about 300 nm to about 430 nm and to emit blue light. The blue photoluminescent material also has an emission peak in a range of about 420 nm to about 480 nm. The full width at half maximum of the emission peak is less than 100 nm, and the photoluminescence quantum yield is in a range of 5% to 100%.

In another aspect, a photocured composition includes a polymer matrix, a blue photoluminescent material mixed in the polymer matrix, and components of a photoinitiator that initiated polymerization to form the polymer matrix. The blue photoluminescent material is selected to absorb ultraviolet light with a maximum wavelength in a range of about 300 nm to about 430 nm and to emit blue light with an emission peak in a range of about 420 nm to about 480 nm, wherein the full width at half maximum of the emission peak is less than 100 nm, and the photoluminescence quantum yield is in a range of 5% to 100%.

In another aspect, a method of fabricating a light emitting device includes dispensing a first photo-curable fluid over a display having a backplane and an array of ultraviolet light emitting diodes electrically integrated with backplane circuitry of the backplane, activating a first plurality of light emitting diodes in the array of light emitting diodes to illuminate and polymerize the one or more monomers to form a first color conversion layer over each of the first plurality of light emitting diodes to convert light from the first plurality of light emitting diodes to blue light, each color conversion layer including blue photoluminescent material mixed in a polymer matrix, and removing an uncured remainder of the first photo-curable fluid. The first photo-curable fluid includes a blue photoluminescent material selected to absorb ultraviolet light with a maximum wavelength in a range of about 300 nm to about 430 nm and to emit blue light with an emission peak in a range of about 420 nm to about 480 nm, wherein the full width at half maximum of the emission peak is less than 100 nm, and the photoluminescence quantum yield is in a range of 5% to 100%, one or more monomers, and a photoinitiator that initiates polymerization of the one or more monomers in response to absorption of the ultraviolet light.

Implementations of these aspects may include one or more of the following features.

The composition typically includes about 0.1 wt % to about 10 wt % of the blue photoluminescent material, about 0.5 wt % to about 5 wt % of the photoinitiator, and about 1 wt % to about 90 wt % of the one or more monomers. In some cases, the composition includes a solvent. A composition with a solvent typically includes about 0.1 wt % to about 10 wt % of the blue photoluminescent material, about 0.5 wt % to about 5 wt % of the photoinitiator, about 1 wt % to about 90 wt % of the one or more monomers, and about 10 wt % to about 90 wt % of the solvent.

The blue photoluminescent material can be an organic material, an organometallic material, or a polymeric material. In some cases, the blue photoluminescent material is an organic material, and the organic material is a free radical. The blue photoluminescent material can be fluorescent or phosphorescent.

Advantages of the blue color converters and systems and devices including the blue color converters include high photoluminescence quantum yield, long lifetime, and long shelf lifetime.

The details of one or more embodiments of the subject matter of this disclosure are set forth in the accompanying drawings and the description. Other features, aspects, and advantages of the subject matter will become apparent from the description, the drawings, and the claims.

BRIEF DESCRIPTION OF THE DRAWINGS

FIG. 2 is a schematic top view of a micro-LED array that has already been integrated with a backplane.

FIG. 3A is a schematic top view of a portion of a micro-LED array. FIG. 3B is a schematic cross-sectional view of the portion of the micro-LED array from FIG. 3A.

FIGS. 6A-6E illustrate a method of fabricating a micro-LED array and isolation walls on a backplane.

FIGS. 7A-7D illustrate another method of fabricating a micro-LED array and isolation walls on a backplane.

Like reference symbols in the various drawings indicate like elements.

DETAILED DESCRIPTION

Quantum dots can be dispersed in acrylate formulations for inkjet printing. Followed by UV curing, the quantum dots locked in a polyacrylate matrix can be used as a color conversion layer for advanced displays. However, while red and green light can be achieved by quantum dots, quantum dots that convert UV light to blue light (e.g., ZeS/Se/Te quantum dots) typically suffer from low photoluminescence quantum yield (PLQY), short working lifetime, and short shelf lifetime.

A technique that may address problems associated with the lack of blue color conversion agents for micro-LEDs with UV backlight includes using materials other than quantum dots for blue color conversion agents. These blue color conversion agents can be included in a formulation for a micro-LED blue color conversion layer formed by self-aligned curing as described in this disclosure.

A formulation for a micro-LED blue color conversion layer typically includes a blue color conversion agent (e.g., free of quantum dots), a reactive component, and a photoinitiator. The formulation may optionally include one or more of a solvent, a functional component (e.g., high refraction index additive, a surfactant, a stray light absorber or UV blocker).

Suitable blue color conversion agents include fluorescent and phosphorescent organic molecules, organic radicals, organometallic complexes, and polymers including one or more of these color conversion agents. Blue color conversion agents are selected to have strong absorption of UV light with a maximum wavelength ($\lambda_{max}$) in a range of about 300 nm to about 430 nm and to emit blue light with an emission peak in a range of about 420 nm to about 480 nm. The full width at half maximum (FWHM) the emission peak is typically less than 100 nm, and the photoluminescence quantum yield (PLQY) is typically in a range of 5% to 100%.

Figure 1A:
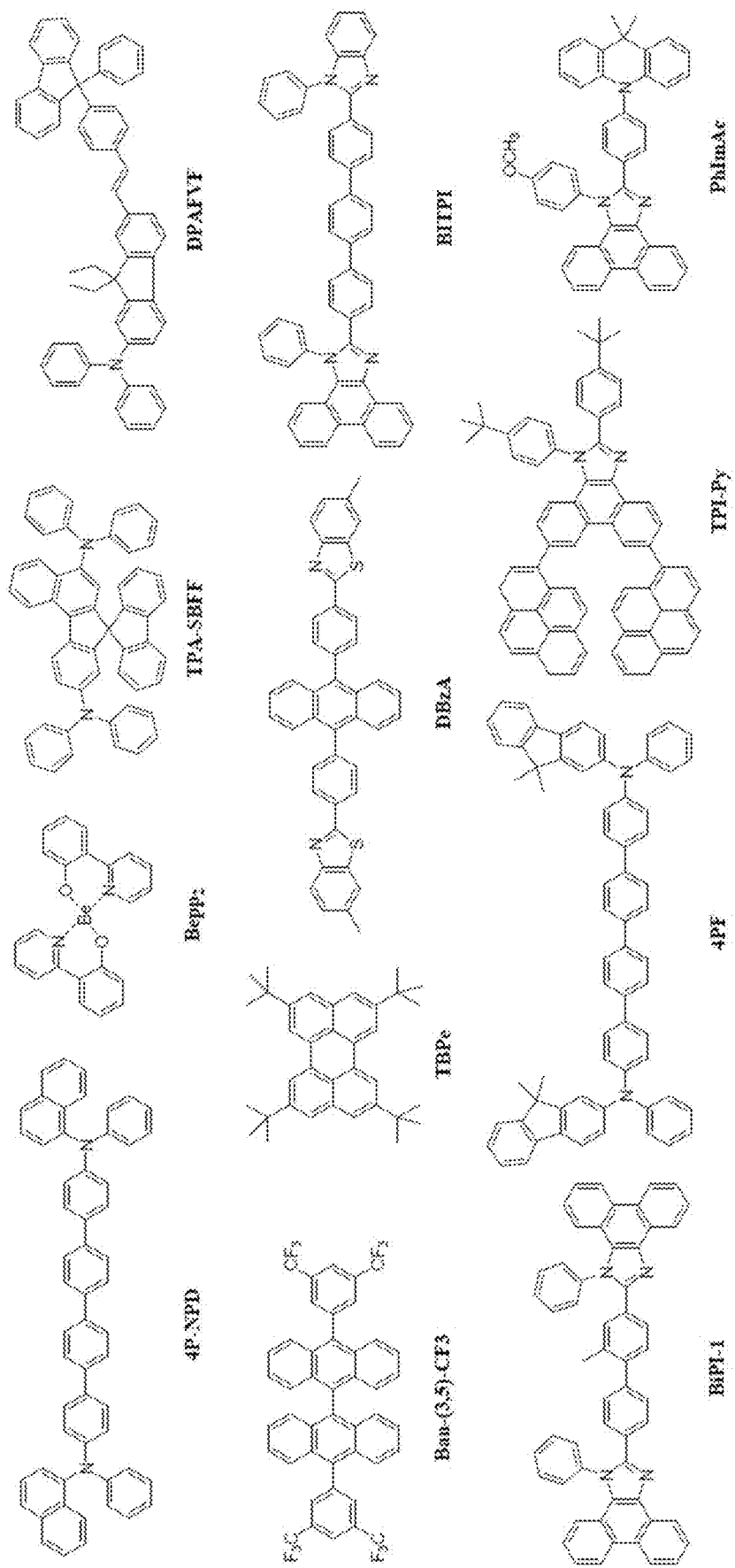
FIG. 1A shows structural formulas of blue fluorescent molecules.
Figure 1B:
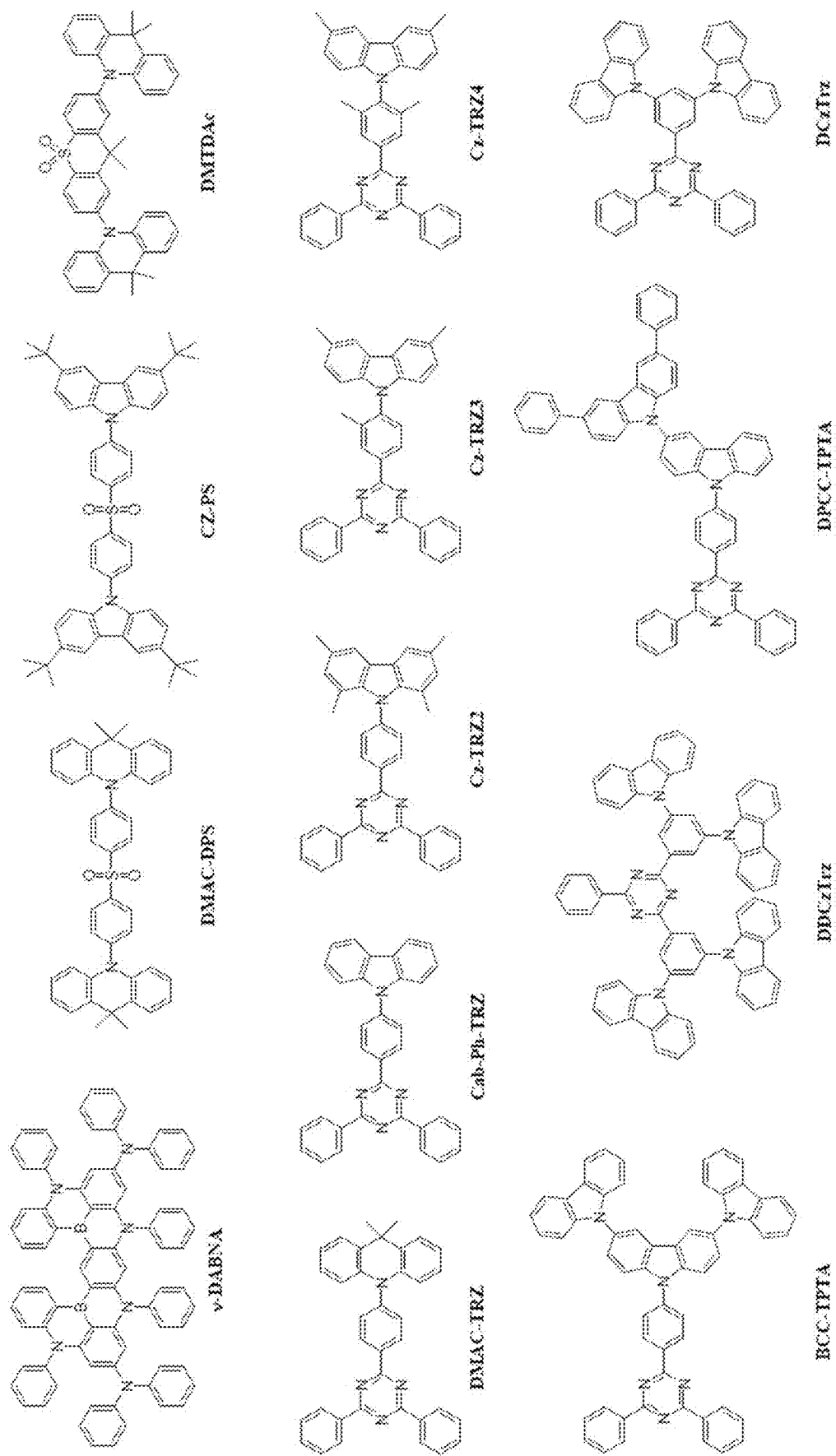
FIG. 1B shows structural formulas of blue thermally activated delayed fluorescent molecules.
Figure 1B:
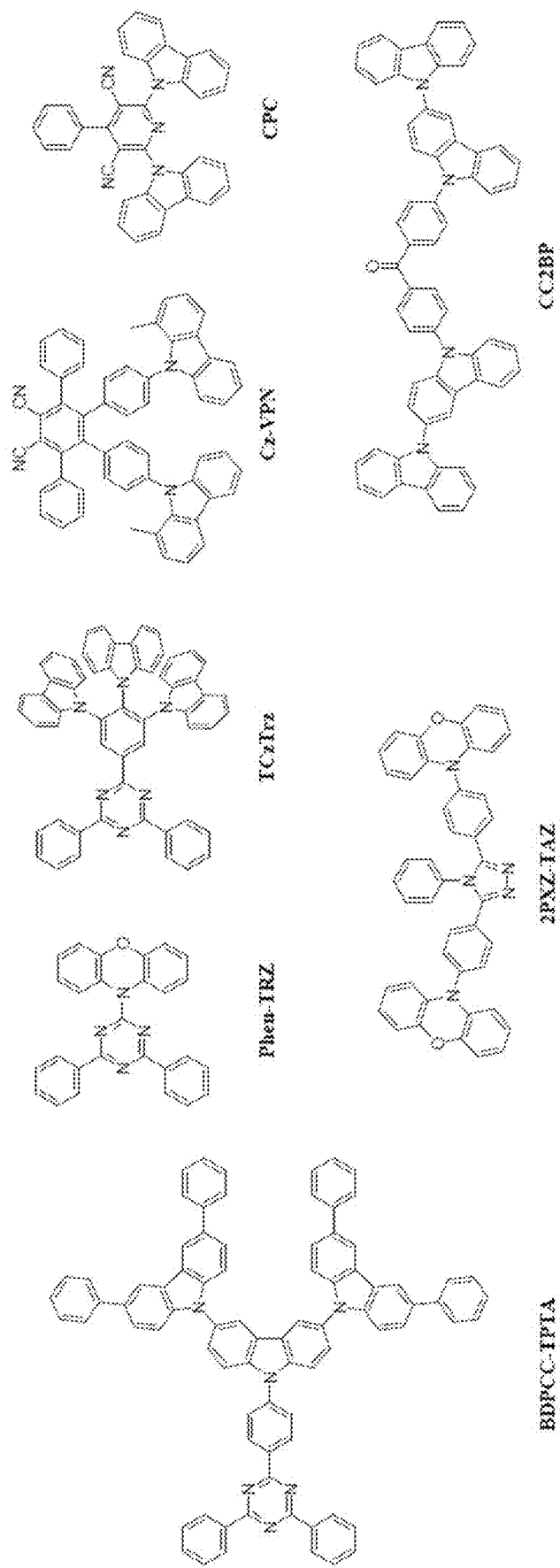
Figure 1C:
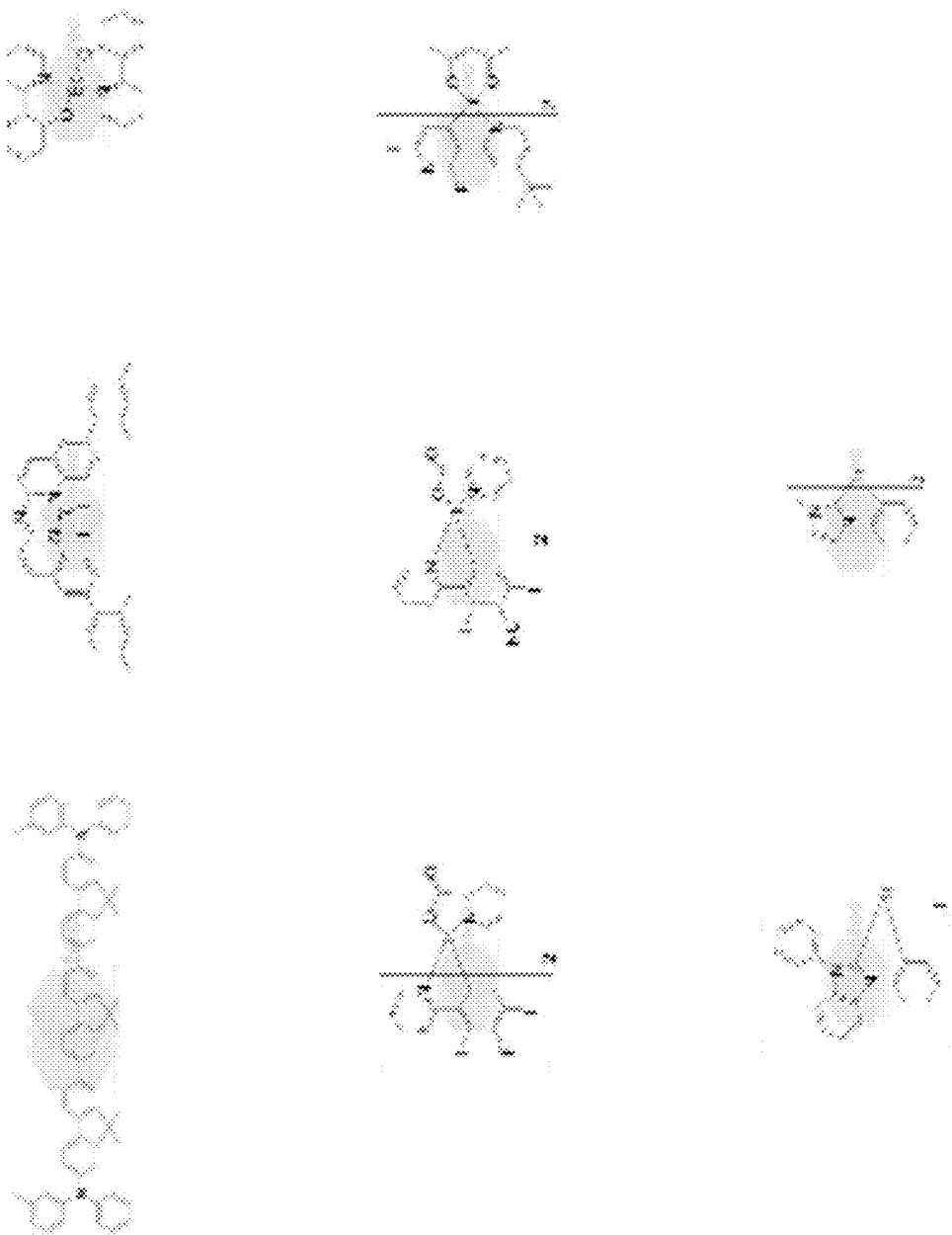
FIG. 1C shows structural formulas of blue phosphorescent organic and organometallic complexes.

Examples of suitable blue color conversion agents include LUMILUX Blue CD 310, LUMILUX Blue CD 710, and LUMILUX Dispersion Blue CD 910 (available from Honeywell International Inc.). FIG. 1A shows structural formulas of the blue fluorescent molecules 4P-NPD, Bepp$_2$, TPA-SBFF, DPAFVF, Ban-(3,5)-CF3, TBPe, DBzA, BITPI, BiPI-1, 4PF, TPI-Py, and PhImA. FIG. 1B shows structural formulas of blue thermally activated delayed fluorescent (TADF) molecules v-DABNA, DMAC-DPS, CZ-PS, DMT-DAc, DMAC-TRZ, Cab-Ph-TRZ, Ca-TRZ2, Cz-TRZ3, Cz-TRZ4, BCC-TPTA, DDCzTrz, DPCC-TPTA, DCzTrz, BDPCC-TPTA, Phen-TRZ, TCzTrz, Cz-VPN, CPC, 2PXZ-TAZ, and CC2BP. FIG. 1C shows structural formulas of blue phosphorescent organic and organometallic complexes including a metalloid (boron) and metals (beryllium and iridium).

Formulations for micro-LED red and green color conversion layers typically include a red or green color conversion agent, respectively, a reactive component, and a photoinitiator. The formulation may optionally include one or more of a solvent, a functional component (e.g., high refraction index additive, a surfactant, a stray light absorber or UV blocker).

The red and green color conversion agents are materials that emit visible radiation in a first visible wavelength band in response to absorption of UV radiation or visible radiation in a second visible wavelength band. The UV radiation typically has a wavelength in a range of 200 nm to 400 nm. The visible radiation typically has a wavelength or wavelength band in a range of 500 nm to 800 nm. The first visible wavelength band is different (e.g., more energetic) than the second visible wavelength band. That is, the color conversion agents are materials that can convert the shorter wavelength light from a micro-LED into longer wavelength light.

The red and green color conversion agents can include photoluminescent materials, such as organic or inorganic molecules, nanomaterials (e.g., nanoparticles, nanostructures, quantum dots), or other appropriate materials. Suitable nanomaterials typically include one or more III-V compounds. Examples of suitable III-V compounds include CdSe, CdS, InP, PbS, CuInP, ZnSeS, and GaAs. In some cases, the nanomaterials include one or more elements selected from the group consisting of cadmium, indium, copper, silver, gallium, germanium, arsenide, aluminum, boron, iodide, bromide, chloride, selenium, tellurium, and phosphorus. In certain cases, the nanomaterials include one or more perovskites.

The quantum dots can be homogeneous or can have a core-shell structure. The quantum dots can have an average diameter in a range of about 1 nm to about 10 nm. One or more organic ligands are typically coupled to an exterior surface of the quantum dots. The organic ligands promote dispersion of the quantum dots in solvents. Suitable organic ligands include aliphatic amine, thiol or acid compounds, in which the aliphatic part typically has 6 to 30 carbon atoms. Examples of suitable nanostructures include nanoplatelets, nanocrystals, nanorods, nanotubes, and nanowires.

The reactive components include monomers, such as (meth)acrylate monomers, and can include one or more mono(meth)acrylates, di(meth)acrylates, tri(meth)acrylates, tetra(meth)acrylates, or a combination thereof. The reactive components can be provided by a negative photoresist, e.g., SU-8 photoresist. Examples of suitable mono(meth)acrylates include isobornyl (meth)acrylates, cyclohexyl (meth)acrylates, trimethylcyclohexyl (meth)acrylates, diethyl (meth)acrylamides, dimethyl (meth)acrylamides, and tetrahydrofurfuryl (meth)acrylates. The reactive component may include cross-linkers or other reactive compounds. Examples of suitable cross-linkers include polyethylene glycol di(meth)acrylates (e.g., diethylene glycol di(meth)acrylate or tripropylene glycol di(meth)acrylates), N,N'-methylenebis-(meth)acrylamides, pentaerythritol tri(meth)acrylates, and pentaerythritol tetra(meth)acrylates. Examples of suitable reactive compounds include polyethylene glycol (meth)acrylates, vinylpyrrolidone, vinylimidazole, styrenesulfonate, (meth)acrylamides, alkyl(meth)acrylamides, dialkyl(meth)acrylamides), hydroxyethyl(meth)acrylates, morpholinoethyl acrylates, and vinylformamides.

The photoinitiator initiates polymerization in response to radiation such as UV radiation, UV-LED radiation, visible radiation, and electron beam radiation. In some cases, the photoinitiator is responsive to UV or visible radiation. Suitable photoinitiators include free radical photoinitiators, such as bulk cure photoinitiators and surface cure photoinitiators.

Bulk cure photoinitiators cleave upon exposure to UV radiation, yielding a free radical, which may initiate polymerization. Bulk cure photoinitiators can be useful for both surface and through or bulk cure of the dispensed droplets. Bulk cure photoinitiators include benzoin ethers, benzyl ketals, acetyl phenones, alkyl phenones, phosphine oxides, benzophenone compounds, and thioxane compounds.

Surface cure photoinitiators are activated by UV radiation and form free radicals by hydrogen abstraction from a second compound, which becomes the actual initiating free radical. This second compound is often called a co-initiator or polymerization synergist, and may be an amine synergist. Amine synergists are used to diminish oxygen inhibition, and therefore, surface cure photoinitiators can be useful for fast surface cures. Surface cure photoinitiators include benzophenone compounds and thioxanthone compounds. An amine synergist is an amine with an active hydrogen. Amine synergists, such as amine-containing acrylates, may be combined with a benzophenone photoinitiator in a resin precursor composition formulation to: a) limit oxygen inhibition, b) fast cure a droplet or layer surface so as to fix the dimensions of the droplet or layer surface, and c), increase layer stability through the curing process.

Examples of suitable photoinitiators include 1-hydroxy-cyclohexylphenyl ketone, 4-isopropylphenyl-2-hydroxy-2-methyl propan-1-one, 1-[4-(2-hydroxyethoxy)-phenyl]-2-hydroxy-2-methyl-1-propan-1-one, 2,2-dimethyl-2-hydroxy-acetophenone, 2,2-dimethoxy-2-phenylacetophenone, 2-hydroxy-2-methylpropionphenone, diphenyl (2,4,6-trimethylbenzoyl) phosphine oxide, bis(2,6-dimethoxy-benzoyl)-2,4,6 trimethyl phenyl phosphine oxide, 2-methyl-1-1[4-(methylthio)phenyl]-2-morpholino-propan-1-one, 3,6-bis(2-methyl-2-morpholino-propionyl)-9-n-octylcarbazole, 2-benzyl-2-(dimethylamino)-1-(4-morpholinyl)phenyl)-1-butanone, benzophenone, 2,4,6-trimethylbenzophenone, isopropyl thioxanthone, phenylbis (2,4,6-trimethylbenzoyl)phosphine oxide, 2-hydroxy-2-methyl-1phenyl-1-propanone. Suitable blends of photoinitiators commercially available include Darocur 4265, Irgacure 184, Irgacure 250, Irgacure 270, Irgacure 295, Irgacure 369, Irgacure 379, Irgacure 500, Irgacure 651, Irgacure 754, Irgacure 784, Irgacure 819, Irgacure 907, Irgacure 1173, Irgacure 2100, Irgacure 2022, Irgacure 4265, Irgacure TPO, Irgacure TPO-L, Esacure KT37, Esacure KT55, Esacure KT0046, Omnicat 250, and Omnicat 550. Suitable amine synergists include secondary and tertiary amine compounds with or without acrylic groups, such as diethanolamine, triethanolamine, and Genomer 5142.

Optionally, the photocurable composition can include a solvent. The solvent can be organic or inorganic. Examples of suitable solvents include water, ethanol, toluene, dimethylformamide, methylethylketone, or a combination thereof. The solvent can be selected to provide a desired surface tension or viscosity for the photocurable composition. The solvent can also improve chemical stability of the other components.

Optionally, the photocurable composition can include a straylight absorber or a UV blocker. Examples of suitable straylight absorbers include Disperse Yellow 3, Disperse Yellow 7, Disperse Orange 13, Disperse Orange 3, Disperse Orange 25, Disperse Black 9, Disperse Red 1 acrylate, Disperse Red 1 methacrylate, Disperse Red 19, Disperse Red 1, Disperse Red 13, and Disperse Blue 1. Examples of suitable UV blockers include benzotriazolyl hydroxyphenyl compounds.

Optionally, the first photocurable composition can include one or more other functional ingredients. As one example, the functional ingredients can affect the optical properties of the color conversion layer. For example, the functional ingredients can include nanoparticles with a sufficiently high index of refraction (e.g., at least about 1.7) that the color conversion layer functions as an optical layer that adjusts the optical path of the output light, e.g., provides a microlens. Examples of suitable nanoparticles include $TiO_2$, $ZnO_2$, $ZrO_2$, $CeO_2$, or a mixture of two or more of these oxides. Alternatively or in addition, the nanoparticles can have an index of refraction selected such that the color conversion layer functions as an optical layer that reduces total reflection loss, thereby improving light extraction. As another example, the functional ingredients can include a dispersant or surfactant to adjust the surface tension of the photocurable composition. Examples of suitable dispersants or surfactants include siloxane and polyethylene glycol. As yet another example, the functional ingredients can include a photoluminescent pigment that emits visible radiation. Examples of suitable photoluminescent pigments include zinc sulfide and strontium aluminate.

In some cases, the photocurable composition includes up to about 90 wt % of the reactive component (e.g., about 10 wt % to about 90 wt %), about 0.5 wt % to about 5 wt % of a photoinitiator, and about 0.1 wt % to about 10 wt % (e.g., about 1 wt % to about 2 wt %) of a color conversion agent. The photocurable composition may also include a solvent (e.g., up to about 10 wt % of a solvent).

The photocurable composition can optionally include up to about 5 wt % of a surfactant or dispersant, about 0.01 wt % to about 5 wt % (e.g., about 0.1 wt % to about 1 wt %) of a straylight absorber, or any combination thereof.

A viscosity of the photocurable composition is typically in a range of about 10 cP (centiPoise) to about 2000 cP at room temperature (e.g., about 10 cP to about 150 cP). A surface tension of the photocurable composition is typically in a range of about 20 milliNewtons per meter (mN/m) to about 60 mN/m (e.g., about 40 mN/m to about 60 mN/m). After curing, an elongation at break of the cured photocurable composition is typically in a range of about 1% to about 200%. A tensile strength of the cured photocurable composition is typically in a range of about 1 megaPascal (MPa) to about 1 gigaPascal (GPa). The photocurable composition can be applied in one or more layers, and a thickness of the cured photocurable composition is typically in a range of about 10 nm to about 100 microns (e.g., about 10 nm to about 20 microns, about 10 nm to about 1000 nm, or about 10 nm to about 100 nm).

The photocurable compositions described in this disclosure are implemented as color conversion layers in displays, such as micro-LED displays described with respect to FIGS. 2-7.

FIG. 2 illustrates a micro-LED display 10 that includes an array 12 of individual micro-LEDs 14 (see FIGS. 3A and 3B) disposed on a backplane 16. The micro-LEDs 14 are already integrated with backplane circuitry 18 so that each micro-LED 14 can be individually addressed. For example, the backplane circuitry 18 can include a TFT active matrix array with a thin-film transistor and a storage capacitor (not illustrated) for each micro-LED, column address and row address lines 18a, column and row drivers 18b, etc., to drive the micro-LEDs 14. Alternatively, the micro-LEDs 14 can be driven by a passive matrix in the backplane circuitry 18. The backplane 16 can be fabricated using conventional CMOS processes.

FIGS. 3A and 3B illustrate a portion 12a of the micro-LED array 12 with the individual micro-LEDs 14. All of the micro-LEDs 14 are fabricated with the same structure so as to generate the same wavelength range (this can be termed "monochrome" micro-LEDs). For example, the micro-LEDs 14 can generate light in the ultraviolet (UV), e.g., the near ultraviolet, range. For example, the micro-LEDs 14 can generate light in a range of 365 to 405 nm. As another example, the micro-LEDs 14 can generate light in the violet or blue range. The micro-LEDs can generate light having a spectral bandwidth of 20 to 60 nm.

FIG. 3B illustrates a portion of the micro-LED array that can provide a single pixel. Assuming the micro-LED display is a three-color display, each pixel includes three sub-pixels, one for each color, e.g., one each for the blue, green and red color channels. As such, the pixel can include three micro-LEDs 14a, 14b, 14c. For example, the first micro-LED 14a can correspond to a blue subpixel, the second micro-LED 14b can correspond to a green subpixel, and the third micro-LED 14c can correspond to a red subpixel. However, the techniques discussed below are applicable to micro-LED displays that use a larger number of colors, e.g., four or more colors. In this case, each pixel can include four or more micro-LEDs, with each micro-LED corresponding to a respective color. In addition, the techniques discussed below are applicable to micro-LED displays that use just two colors.

In general, the monochrome micro-LEDs 14 can generate light in a wavelength range having a peak with a wavelength no greater than the wavelength of the highest-frequency color intended for the display, e.g., purple or blue light. The color conversion agents can convert this short wavelength light into longer wavelength light, e.g., red or green light for red or green subpixels. If the micro-LEDs generate UV light, then color conversion agents can be used to convert the UV light into blue light for the blue subpixels.

Vertical isolation walls 20 are formed between neighboring micro-LEDs. The isolation walls provide for optical isolation to help localize polymerization and reduce optical crosstalk during the in-situ polymerization discussed below. The isolation walls 20 can be a photoresist or metal, and can be deposited by conventional lithography processes. As shown in FIG. 3A, the walls 20 can form a rectangular array, with each micro-LED 14 in an individual recess 22 defined by the walls 20. Other array geometries, e.g., hexagonal or offset rectangular arrays, are also possible. Possible processes for back-plane integration and isolation wall formation are discussed in more detail below.

The walls can have a height H of about 3 to 20 μm. The walls can have a width W of about 2 to 10 μm. The height H can be greater than the width W, e.g., the walls can have an aspect ratio of 1.5:1 to 5:1. The height H of the wall is sufficient to block light from one micro-LED from reaching an adjacent micro-LED.

Figure 4A:
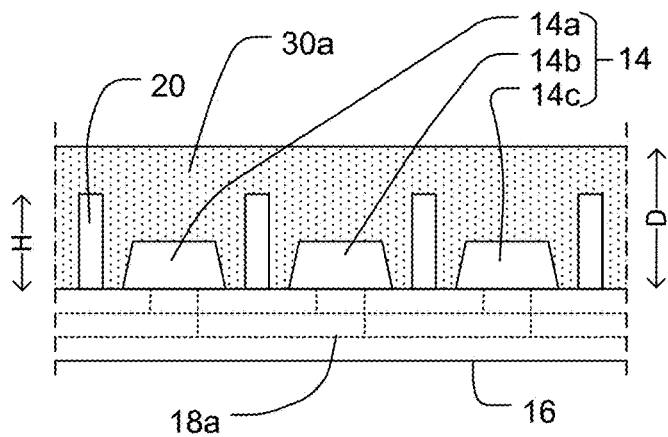
FIGS. 4A-4H illustrate a method of selectively forming color conversion layers over a micro-LED array.

FIGS. 4A-4H illustrate a method of selectively forming color conversion layers over a micro-LED array. Initially, as shown in FIG. 4A, a first photocurable composition 30a is deposited over the array of micro-LEDs 14 that are already integrated with the backplane circuitry. The first photocurable composition 30a can have a depth D greater than a height H of the isolation walls 20.

Figure 5A:
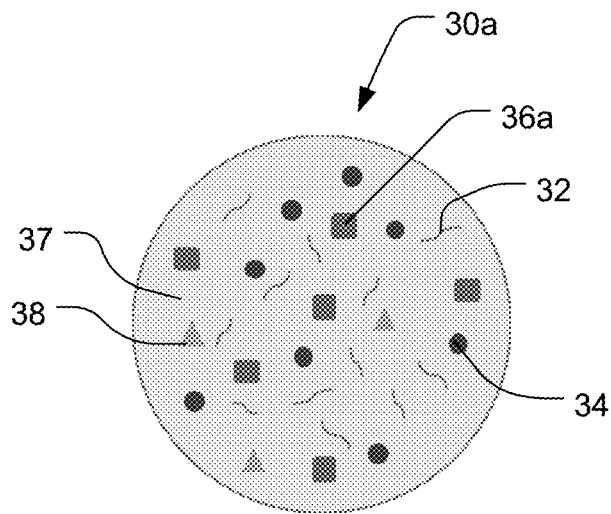
FIGS. 5A-5C illustrate formulations of photocurable composition.
Figure 5B:
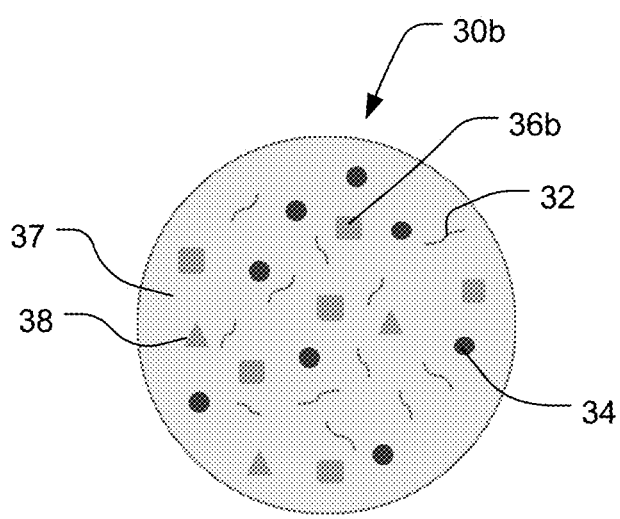
Figure 5C:
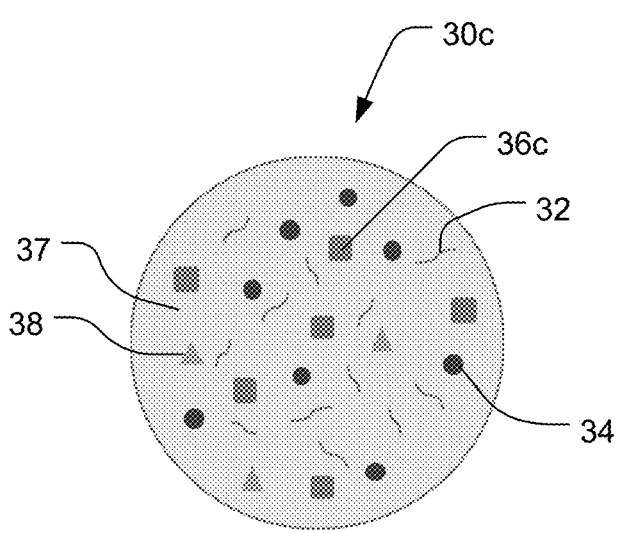

Referring to FIGS. 5A-5C, a photocurable composition (e.g., first photocurable composition 30a, second photocurable composition 30b, third photocurable composition 30c, etc.) includes a polymerizable components 32, a photoinitiator 34 to trigger polymerization under illumination of a wavelength corresponding to the emission of the micro-LEDs 14, and color conversion agents 36a. The polymerizable component 32 includes a reactive component and an anti-oxygen inhibition additive as described herein.

Curing of the photocurable composition forms a polymer matrix, e.g., a polyacrylate, that contains the blue photoluminescent material. In addition, components of the photoinitiator 34 may be present in the cured photocurable composition (the photopolymer), where the components are fragments of the photoinitiator formed during breaking of bonds in the photoinitiator in the photo-initiation process.

Returning to FIG. 4A, the first photocurable composition 30a can be deposited on the display over the micro-LED array by a spin-on, dipping, spray-on, or inkjet process. An inkjet process can be more efficient in consumption of the first photocurable composition 30a.

Figure 4B:
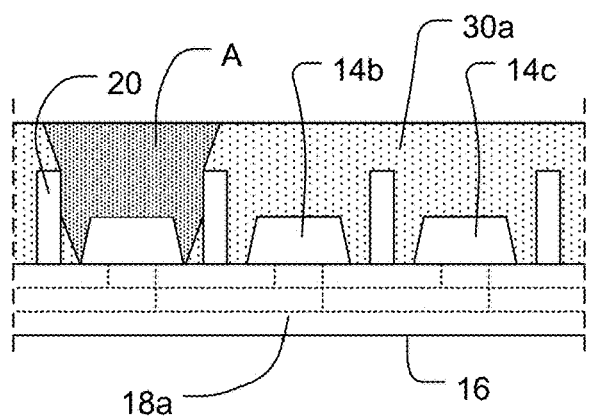

Next, as shown in FIG. 4B, the circuitry of the backplane 16 is used to selectively activate a first plurality of micro-LEDs 14a. This first plurality of micro-LEDs 14a correspond to the sub-pixels of a first color. In particular, the first plurality of micro-LEDs 14a correspond to the sub-pixels for the color of light to be generated by the color conversion agents in the photocurable composition 30a. For example, assuming the color conversion agents in the fluid 30a will convert light from the micro-LED 14 into blue light, then only those micro-LEDs 14a that correspond to blue sub-pixels are turned on. Because the micro-LED array is already integrated with the backplane circuitry 18, power can be supplied to the micro-LED display 10 and control signals can be applied by a microprocessor to selectively turn on the micro-LEDs 14a.

Figure 4C:
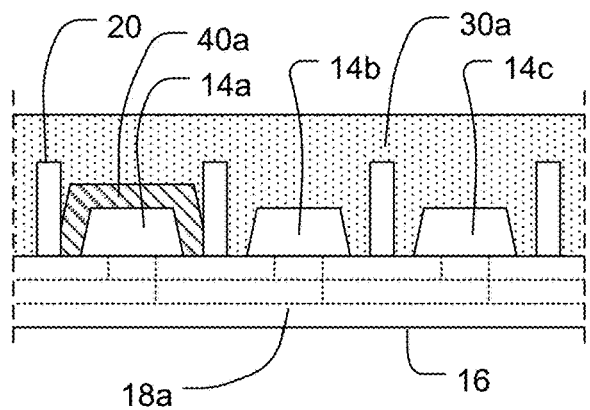

Referring to FIGS. 4B and 4C, activation of the first plurality of micro-LEDs 14a generates illumination A (see FIG. 4B) which causes in-situ curing of the first photocurable composition 30a to form a first solidified color conversion layer 40a (see FIG. 4C) over each activated micro-LED 14a. In short, the fluid 30a is cured to form color conversion layers 40a, but only on the selected micro-LEDs 14a. For example, a color conversion layer 40a for converting to blue light can be formed on each micro-LED 14a.

In some implementations, the illumination from the selected micro-LEDs 14a does not reach the other micro-LEDs 14b, 14c. In this circumstance, the isolation walls 20 may not be necessary. However, if the spacing between the micro-LEDs 14 is sufficiently small, isolation walls 20 can affirmatively block illumination A from the selected micro-LED 14a from reaching the area over the other micro-LEDs that would be within the penetration depth of the illumination from those other micro-LEDs. Isolation walls 20 can also be included, e.g., simply as insurance against illumination reaching the area over the other micro-LEDs.

The driving current and drive time for the first plurality of micro-LEDs 14a can be selected for appropriate photon dosage for the photocurable composition 30a. The power per subpixel for curing the fluid 30a is not necessarily the same as the power per subpixel in a display mode of the micro-LED display 10. For example, the power per subpixel for the curing mode can be higher than the power per subpixel for the display mode.

Figure 4D:
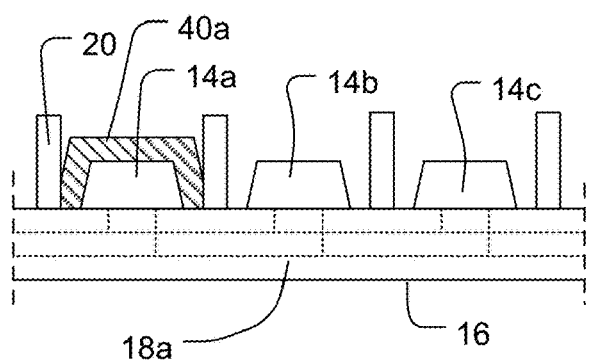

Referring to FIG. 4D, when curing is complete and the first solidified color conversion layer 40a is formed, the residual uncured first photocurable composition is removed from the display 10. This leaves the other micro-LEDs 14b, 14c, exposed for the next deposition steps. In some implementations, the uncured first photocurable composition 30a is simply rinsed from the display with a solvent, e.g., water, ethanol, toluene, dimethylformamide, or methylethylketone, or a combination thereof. If the photocurable composition 30a includes a negative photoresist, then the rinsing fluid can include a photoresist developer for the photoresist.

Figure 4E:
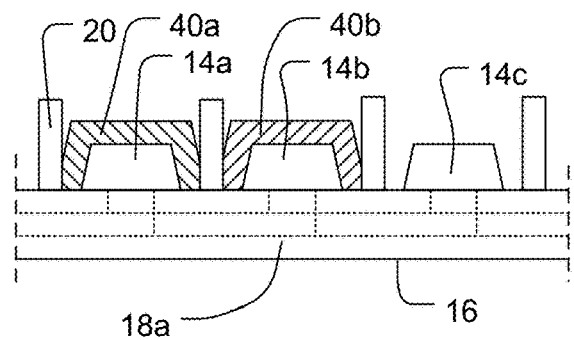

Referring to FIGS. 4E and 5B, the treatment described above with respect to FIGS. 4A-4D is repeated, but with a second photocurable composition 30b and activation of a second plurality of micro-LEDs 14b. After rinsing, a second color conversion layer 40b is formed over each of the second plurality of micro-LEDs 14b.

The second photocurable composition 30b is similar to the first photocurable composition 30a, but includes color conversion agents 36b to convert the shorter wavelength light from the micro-LEDs 14 into longer wavelength light of a different second color. The second color can be, for example, green.

The second plurality of micro-LEDs 14b correspond to the sub-pixels of a second color. In particular, the second plurality of micro-LEDs 14b correspond to the sub-pixels for the color of light to be generated by the color conversion agents in the second photocurable composition 30b. For example, assuming the color conversion agents in the fluid 30a will convert light from the micro-LED 14 into green light, then only those micro-LEDs 14b that correspond to green sub-pixels are turned on.

Figure 4F:
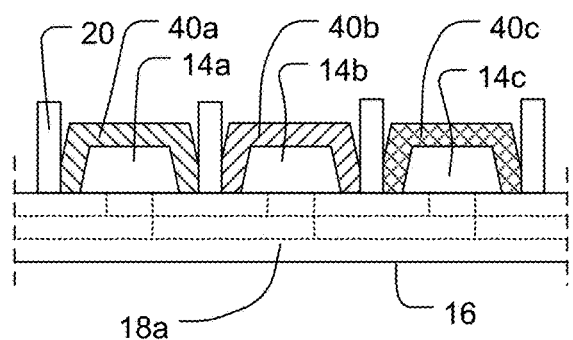

Referring to FIGS. 4F and 5C, optionally the treatment described above with respect to FIGS. 4A-4D is repeated yet again, but with a third photocurable composition 30c and activation of a third plurality of micro-LEDs 14c. After rinsing, a third color conversion layer 40c is formed over each of the third plurality of micro-LEDs 14c.

The third photocurable composition 30c is similar to the first photocurable composition 30a, but includes color conversion agents 36c to convert the shorter wavelength light from the micro-LEDs 14 into longer wavelength light of a different third color. The third color can be, for example, red.

The third plurality of micro-LEDs 14c correspond to the sub-pixels of a third color. In particular, the third plurality of micro-LEDs 14c correspond to the sub-pixels for the color of light to be generated by the color conversion agents in the third photocurable composition 30c. For example, assuming the color conversion agents in the fluid 30c will convert light from the micro-LED 14 into red light, then only those micro-LEDs 14c that correspond to red sub-pixels are turned on.

In this specific example illustrated in FIGS. 4A-4F, color conversion layers 40a, 40b, 40c are deposited for each color sub-pixel. This is needed, e.g., when the micro-LEDs generate ultraviolet light.

However, the micro-LEDs 14 could generate blue light instead of UV light. In this case, the coating of the display 10 by a photocurable composition containing blue color conversion agents can be skipped, and the process can be performed using the photocurable compositions for the green and red subpixels. One plurality of micro-LEDs is left without a color conversion layer, e.g., as shown in FIG. 4E. The process shown by FIG. 4F is not performed. For example, the first photocurable composition 30a could include green CCAs and the first plurality of 14a of micro-LEDs could correspond to the green subpixels, and the second photocurable composition 30b could include red CCAs and the second plurality 14b of micro-LEDs could correspond to the red subpixels.

As noted above, the photocurable compositions 30a, 30b, 30c can include other components 38, such as a straylight absorber, UV blocker, refractive index adjuster, dispersant, or surfactant.

Figure 4G:
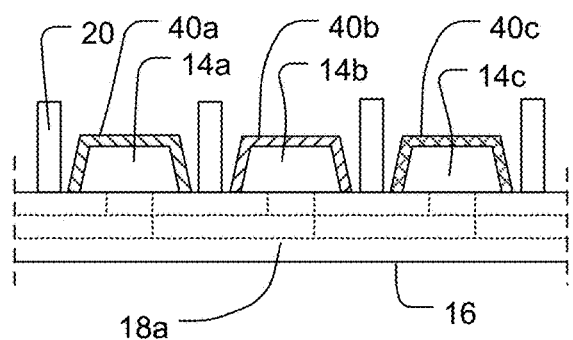

Assuming that the fluids 30a, 30b, 30c included a solvent 37, some solvent may be trapped in the color conversion layers 40a, 40b, 40c, Referring to FIG. 4G, this solvent can be evaporated, e.g., by exposing the micro-LED array to heat, such as by IR lamps. Evaporation of the solvent from the color conversion layers 40a, 40b, 40c can result in shrinking of the layers so that the final layers are thinner.

Removal of the solvent and shrinking of the color conversion layers 40a, 40b, 40c can increase concentration of color conversion agents, e.g., quantum dots, thus providing higher color conversion efficiency. On the other hand, including a solvent permits more flexibility in the chemical formulation of the other components of the photocurable compositions, e.g., in the color conversion agents or cross-linkable components.

Figure 4H:
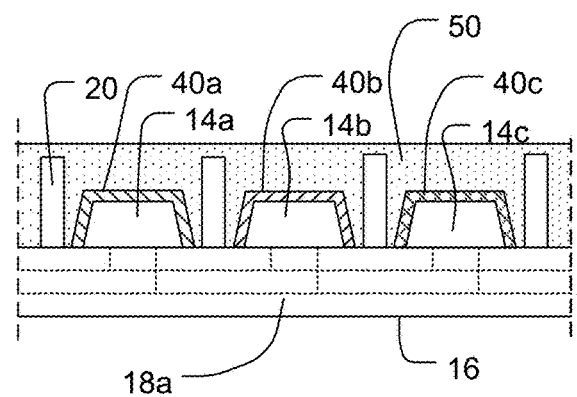

Optionally, as shown in FIG. 4H, a UV blocking layer 50 can be deposited on top of all of the micro-LEDs 14. The UV blocking layer 50 can block UV light that is not absorbed by the color conversion layers 40. The UV blocking layer 50 can be a Bragg reflector, or can simply be a material that is selectively absorptive to UV light (e.g., a benzotriazolyl hydroxyphenyl compound). A Bragg reflector can reflect UV light back toward the micro-LEDs 14, thus increasing energy efficiency. Other layers, such as straylight absorbing layers, photoluminescent layers, and high refractive index layers include materials may also be optionally deposited on micro-LEDs 14.

Thus, as described herein, a photocurable composition includes color conversion agents selected to emit radiation in a first wavelength band in the visible light range in response to absorption of radiation in a second wavelength band in the UV or visible light range, a reactive component (e.g., one or more monomers), and a photoinitiator that initiates polymerization of the active component in response to absorption of radiation in the second wavelength band. The second wavelength band is different than the first wavelength band.

In some implementations, a light-emitting device includes a plurality of light-emitting diodes, and a cured composition in contact with a surface through which radiation in a first wavelength band in the UV or visible light range is emitted from each of the light-emitting diodes. The cured composition includes a nanomaterial selected to emit radiation in a second wavelength band in the visible light range in response to absorption of radiation in the first wavelength band from each of the light-emitting diodes, a photopolymer, and components (e.g., fragments) of a photoinitiator that initiates polymerization of the photopolymer in response to absorption of radiation in the first wavelength band. The second wavelength band is different than the first wavelength band.

In certain implementations, a light-emitting device includes an additional plurality of light-emitting diodes and an additional cured composition in contact with a surface through which radiation in the first wavelength band is emitted from each of the additional light-emitting diodes. The additional cured composition includes an additional CCA selected to emit radiation in a third wavelength band in the visible light range in response to absorption of radiation in the first wavelength band from each of the light-emitting diodes, an additional photopolymer, and components of an additional photoinitiator that initiates polymerization of the photopolymer in response to absorption of radiation in the first wavelength band. The third wavelength band can be different than the second wavelength band.

FIGS. 6A-6E illustrate a method of fabricating a micro-LED array and isolation walls on a backplane. Referring to FIG. 6A, the process starts with the wafer 100 that will provide the micro-LED array. The wafer 100 includes a substrate 102, e.g., a silicon or a sapphire wafer, on which are disposed a first semiconductor layer 104 having a first doping, an active layer 106, and a second semiconductor layer 108 having a second opposite doping. For example, the first semiconductor layer 104 can be an n-doped gallium nitride (n-GaN) layer, the active layer 106 can be a multiple quantum well (MQW) layer 106, and the second semiconductor layer 107 can be a p-doped gallium nitride (p-GaN) layer 108.

Referring to FIG. 6B, the wafer 100 is etched to divide the layers 104, 106, 108 into individual micro-LEDs 14, including the first, second, and third plurality of micro-LEDs 14a, 14b, 14c that correspond to the first, second, and third colors. In addition, conductive contacts 110 can be deposited. For example, a p-contact 110a and an n-contact 110b can be deposited onto the n-GaN layer 104 and p-GaN layer 108, respectively.

Similarly, the backplane 16 is fabricated to include the circuitry 18, as well as electrical contacts 120. The electrical contacts 120 can include first contacts 120a, e.g., drive contacts, and second contacts 120b, e.g., ground contacts.

Referring to FIG. 6C, the micro-LED wafer 100 is aligned and placed in contact with the backplane 16. For example, the first contacts 110a can contact the first contacts 120a, and the second contacts 110b can contact the second contacts 120b. The micro-LED wafer 100 could be lowered into contact with the backplane, or vice-versa.

Next, referring to FIG. 6D, the substrate 102 is removed. For example, a silicon substrate can be removed by polishing away the substrate 102, e.g., by chemical mechanical polishing. As another example, a sapphire substrate can be removed by a laser liftoff process.

Finally, referring to FIG. 6E, the isolation walls 20 are formed on the backplane 16 (to which the micro-LEDs 14 are already attached). The isolation walls can be formed by a conventional process such as deposition of photoresist, patterning of the photoresist by photolithography, and development to remove the portions of the photoresist corresponding to the recesses 22. The resulting structure can then be used as the display 10 for the process described for FIGS. 4A-H4.

FIGS. 7A-7D illustrate another method of fabricating a micro-LED array and isolation walls on a backplane. This process can be similar to the process discussed above for FIGS. 6A-6E, except as noted below.

Referring to FIG. 7A, the process starts similarly to the process described above, with the wafer 100 that will provide the micro-LED array and the backplane 16.

Referring to FIG. 7B, the isolation walls 20 are formed on the backplane 16 (to which the micro-LEDs 14 are not yet attached).

In addition, the wafer 100 is etched to divide the layers 104, 106, 108 into individual micro-LEDs 14, including the first, second and third plurality of micro-LEDs 14a, 14b, 14c. However, the recesses 130 formed by this etching process are sufficiently deep to accommodate the isolation walls 20. For example, the etching can continue so that the recesses 130 extend into the substrate 102.

Next, as shown in FIG. 7C, the micro-LED wafer 100 is aligned and placed in contact with the backplane 16 (or vice-versa). The isolation walls 20 fit into the recesses 130. In addition, the contacts 110 of the micro-LEDs are electrically connected to the contacts 120 of the backplane 16.

Finally, referring to FIG. 7D, the substrate 102 is removed. This leaves the micro-LEDs 14 and isolation walls 20 on the backplane 16. The resulting structure can then be used as the display 10 for the process described for FIGS. 4A-4H.

Terms of positioning, such as vertical and lateral, have been used. However, it should be understood that such terms refer to relative positioning, not absolute positioning with respect to gravity. For example, laterally is a direction parallel to a substrate surface, whereas vertically is a direction normal to the substrate surface.

It will be appreciated to those skilled in the art that the preceding examples are exemplary and not limiting. For example:

Although the above description focuses on micro-LEDs, the techniques can be applied to other displays with other types of light emitting diodes, particularly displays with other micro-scale light emitting diodes, e.g., LEDs less than about 10 microns across.

Although the above description assumes that the order in which the color conversion layers are formed is blue, then green, then red, other orders are possible, e.g., blue, then red, then green. In addition, other colors are possible, e.g., orange and yellow.

It will be understood that various modifications may be made without departing from the spirit and scope of the present disclosure.

What is claimed is:

1. A photocurable composition for forming a color conversion layer, the photocurable composition comprising:

a blue photoluminescent material selected to absorb ultraviolet light with a maximum wavelength in a range of about 300 nm to about 430 nm and to, while in a cured form of the composition in the color conversion layer, emit blue light with an emission peak in a range of about 420 nm to about 480 nm, wherein the full width at half maximum of the emission peak is less than 100 nm, and the photoluminescence quantum yield is in a range of 5% to 100%, and wherein the blue photoluminescent material is an organic material or an organometallic material;

one or more monomers; and a photoinitiator that initiates polymerization of the one or more monomers in response to absorption of the ultraviolet light.

2. The composition of claim 1, wherein the composition comprises:

about 0.1 wt % to about 10 wt % of the blue photoluminescent material;

about 0.5 wt % to about 5 wt % of the photoinitiator; and about 1 wt % to about 90 wt % of the one or more monomers.

3. The composition of claim 1, wherein the composition further comprises a solvent.

4. The composition of claim 3, wherein the composition comprises:

about 0.1 wt % to about 10 wt % of the blue photoluminescent material;

about 0.5 wt % to about 5 wt % of the photoinitiator;

about 1 wt % to about 90 wt % of the one or more monomers; and about 10 wt % to about 90 wt % of the solvent.

5. The composition of claim 1, wherein the blue photoluminescent material is an organic material, and the organic material is a free radical.

6. The composition of claim 1, wherein the blue photoluminescent material is fluorescent.

7. The composition of claim 6, wherein the blue photoluminescent material comprises blue thermally activated delayed fluorescent (TADF) molecules.

8. The composition of claim 1, wherein the blue photoluminescent material is phosphorescent.

9. The composition of claim 1, wherein the one or more monomers comprise (meth)acrylate monomers.

10. A photocured composition comprising:
    a polymer matrix formed from one or more monomers;
    a blue photoluminescent material mixed in the polymer matrix, the blue photoluminescent material selected to absorb ultraviolet light with a maximum wavelength in a range of about 300 nm to about 430 nm and to emit blue light with an emission peak in a range of about 420 nm to about 480 nm, wherein the full width at half maximum of the emission peak is less than 100 nm, and the photoluminescence quantum yield is in a range of 5% to 100%, and wherein the blue photoluminescent material is an organic material or an organometallic material; and
    components of a photoinitiator that initiated polymerization to form the polymer matrix.

11. The composition of claim 10, wherein the polymer matrix comprises a polyacrylate.

12. The composition of claim 10, wherein the blue photoluminescent material is fluorescent.

13. The composition of claim 10 wherein the blue photoluminescent material is phosphorescent.

14. A photocurable composition for forming a color conversion layer, the photocurable composition comprising:
    a blue photoluminescent material selected to absorb ultraviolet light with a maximum wavelength in a range of about 300 nm to about 430 nm and to emit blue light with an emission peak in a range of about 420 nm to about 480 nm, wherein the full width at half maximum of the emission peak is less than 100 nm, and the photoluminescence quantum yield is in a range of 5% to 100%, wherein the blue photoluminescent material is an organic material, and the organic material is a free radical;
    one or more monomers; and
    a photoinitiator that initiates polymerization of the one or more monomers in response to absorption of the ultraviolet light.

15. The composition of claim 14, wherein the composition comprises:
    about 0.1 wt % to about 10 wt % of the blue photoluminescent material;
    about 0.5 wt % to about 5 wt % of the photoinitiator; and
    about 1 wt % to about 90 wt % of the one or more monomers.

16. The composition of claim 14, wherein the composition further comprises a solvent.

17. The composition of claim 16, wherein the composition comprises:
    about 0.1 wt % to about 10 wt % of the blue photoluminescent material;
    about 0.5 wt % to about 5 wt % of the photoinitiator;
    about 1 wt % to about 90 wt % of the one or more monomers; and
    about 10 wt % to about 90 wt % of the solvent.

18. The composition of claim 14, wherein the one or more monomers comprise (meth)acrylate monomers.

* * * * *